(12) United States Patent
Her et al.

(10) Patent No.: US 11,422,905 B2
(45) Date of Patent: Aug. 23, 2022

(54) STORAGE DEVICE AND METHOD OF OPERATING THE SAME

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Youn Ho Jung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 692 days.

(21) Appl. No.: 16/423,568

(22) Filed: May 28, 2019

(65) Prior Publication Data

US 2020/0133806 A1    Apr. 30, 2020

(30) Foreign Application Priority Data

Oct. 25, 2018 (KR) .......................... 10-2018-0128475

(51) Int. Cl.
*G06F 11/00* (2006.01)
*G06F 11/20* (2006.01)
*G11C 16/08* (2006.01)
*G11C 16/14* (2006.01)
*G11C 16/34* (2006.01)
*G11C 16/04* (2006.01)
(Continued)

(52) U.S. Cl.
CPC ...... *G06F 11/2015* (2013.01); *G11C 16/0483* (2013.01); *G11C 16/08* (2013.01); *G11C 16/10* (2013.01); *G11C 16/14* (2013.01); *G11C 16/26* (2013.01); *G11C 16/30* (2013.01); *G11C 16/3445* (2013.01); *G11C 16/3459* (2013.01); *G06F 2201/85* (2013.01)

(58) Field of Classification Search
CPC . G06F 11/2015; G06F 2201/85; G11C 16/08; G11C 16/10; G11C 16/14; G11C 16/30; G11C 16/2445; G11C 16/3459
See application file for complete search history.

(56) References Cited

U.S. PATENT DOCUMENTS 6,381,670 B1 * 4/2002 Lee .................. G11C 11/5628
                                                        365/104
10,453,539 B2 * 10/2019 Seo .................... H02M 3/07
(Continued)

FOREIGN PATENT DOCUMENTS

KR   10-2004-0010231   1/2004
KR   10-2012-0019682   3/2012

*Primary Examiner* — Loan L. T. Truong
(74) *Attorney, Agent, or Firm* — IP & T Group LLP

(57) ABSTRACT

A memory controller controls a memory device including a plurality of memory blocks and a plurality of power modules respectively providing voltages to a plurality of word line groups, the memory controller comprising: a fail block detector detecting fail blocks on which an erase operation has failed among the plurality of memory blocks, and detecting fail word line groups among a plurality of word line groups included in each of the fail blocks; a fail block manager detecting, among the plurality of power modules, a defective power module providing the voltages to two or more fail word line groups each included in a different fail block among the fail blocks; and a power defect controller controlling the memory device such that the defective power module is changed to another power module among the plurality of power modules.

20 Claims, 15 Drawing Sheets

(51) Int. Cl.
*G11C 16/10* (2006.01)
*G11C 16/26* (2006.01)
*G11C 16/30* (2006.01)

(56) References Cited

U.S. PATENT DOCUMENTS

| | | | |
|---|---|---|---|
| 2007/0103974 A1* | 5/2007 | Takeguchi | G11C 16/3445 |
| | | | 365/185.3 |
| 2015/0331769 A1* | 11/2015 | Song | G06F 11/1441 |
| | | | 714/6.2 |
| 2016/0085291 A1* | 3/2016 | Ebsen | G06F 1/3296 |
| | | | 713/320 |
| 2018/0252777 A1* | 9/2018 | Straub | G01R 31/40 |
| 2019/0392918 A1* | 12/2019 | Cariello | G11C 16/30 |
| 2020/0117557 A1* | 4/2020 | Singidi | G06F 11/3447 |

\* cited by examiner

POWER ROUTING TABLE

| Power Module # | WL Group # | WLs |
|---|---|---|
| Power Module_1 | WL_GR1 | WL2~WL8 |
| Power Module_2 | WL_GR2 | WL9~WL16 |
| Power Module_3 | WL_GR3 | WL17~WL24 |
| Power Module_4 | WL_GR4 | WL25~WL31 |
| Power Module_5 | WL_GR5 | WL1,WL32 |

FAIL BLOCK INFORMATION

| Memory Block # | WL Group # | WLs | Status |
|---|---|---|---|
| BLK_1 | WL_GR1 | WL2~WL8 | Pass |
| | WL_GR2 | WL9~WL16 | Fail |
| | WL_GR3 | WL17~WL24 | Pass |
| | WL_GR4 | WL25~WL31 | Pass |
| | WL_GR5 | WL1,WL32 | Pass |

FIG. 10

FAIL BLOCK TABLE

| Memory Block # | WL Group # | WLs | Status |
|---|---|---|---|
| BLK_1 | WL_GR1 | WL2~WL8 | Pass |
| | WL_GR2 | WL9~WL16 | Fail |
| | WL_GR3 | WL17~WL24 | Pass |
| | WL_GR4 | WL25~WL31 | Pass |
| | WL_GR5 | WL1,WL32 | Pass |
| BLK_3 | WL_GR1 | WL2~WL8 | Pass |
| | WL_GR2 | WL9~WL16 | Fail |
| | WL_GR3 | WL17~WL24 | Pass |
| | WL_GR4 | WL25~WL31 | Pass |
| | WL_GR5 | WL1,WL32 | Pass |
| ... | ... | ... | ... |
| BLK_i | WL_GR1 | WL2~WL8 | Pass |
| | WL_GR2 | WL9~WL16 | Pass |
| | WL_GR3 | WL17~WL24 | Pass |
| | WL_GR4 | WL25~WL31 | Fail |
| | WL_GR5 | WL1,WL32 | Pass |

FIG. 11

POWER DEFECT INFORMATION

| WL Group # | Power Defect |
|---|---|
| WL_GR2 | 1 (Defect) / 0 (Normal) |

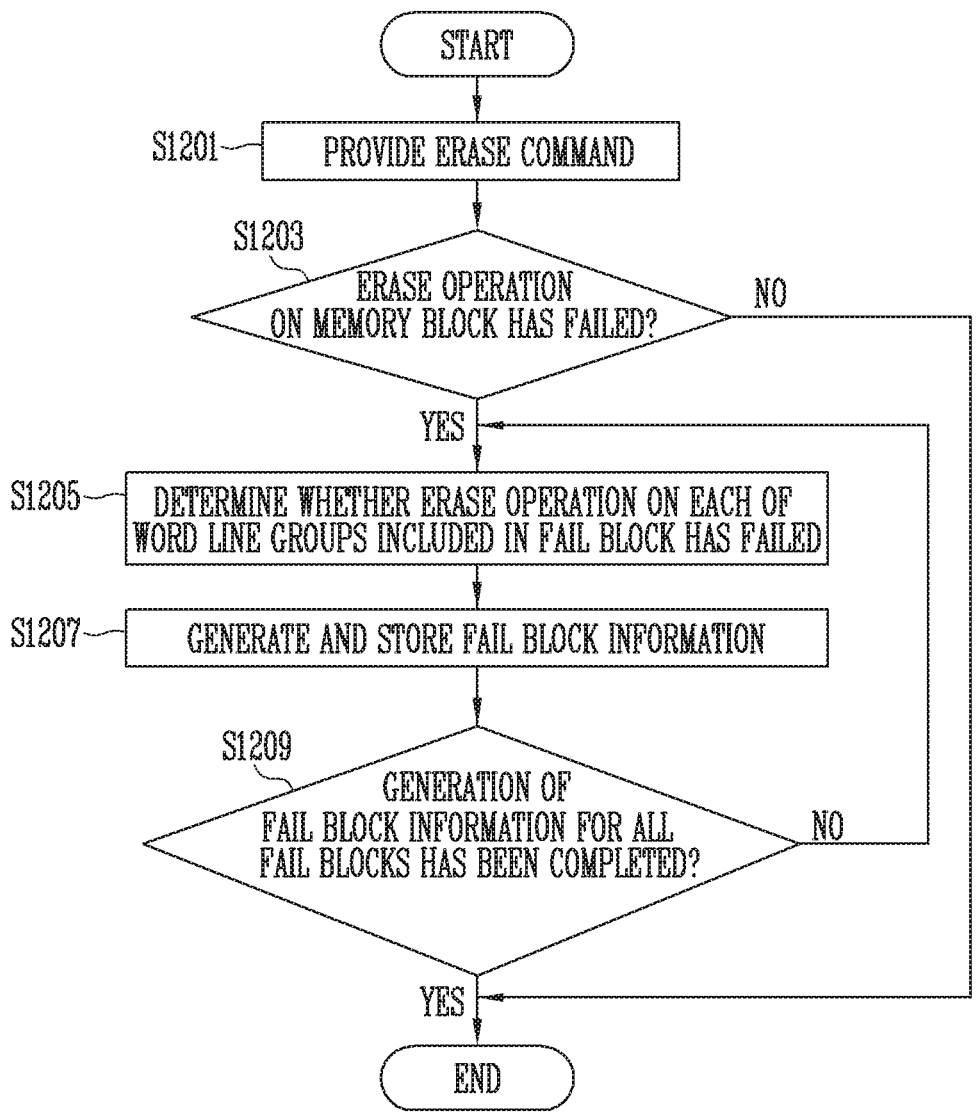

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0128475, filed on Oct. 25, 2018, which is incorporated herein by reference in its entirety.

BACKGROUND

Field of Invention

Various embodiments of the present disclosure generally relate to an electronic device, and more particularly, to a storage device and a method of operating the storage device.

Description of Related Art

Generally, a storage device serves to store data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device is a memory device, which stores data only when power is supplied thereto, and in which data stored therein is lost when power is turned off. Examples of a volatile memory device include a static random access memory (SRAM), and a dynamic random access memory (DRAM).

A nonvolatile memory device is a memory device in which data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device having improved power defect management capability, and a method of operating the storage device.

An embodiment of the present disclosure may provide for a memory controller configured to control a memory device including a plurality of memory blocks each including a plurality of word line groups each coupled to a plurality of memory cells and a plurality of power modules configured to respectively provide voltages to the plurality of word line groups, the memory controller comprising: a fail block detector configured to detect fail blocks on which an erase operation has failed among the plurality of memory blocks, and detect fail word line groups among a plurality of word line groups included in each of the fail blocks; a fail block manager configured to detect, among the plurality of power modules, a defective power module providing the voltages to two or more fail word line groups each included in a different fail block among the fail blocks; and a power defect controller configured to control the memory device such that the defective power module is changed to another power module among the plurality of power modules.

An embodiment of the present disclosure may provide for a memory device including: a memory cell array including a plurality of memory blocks each including a plurality of word line groups each coupled to a plurality of memory cells; a voltage generator including a plurality of power modules configured to respectively provide voltages to the plurality of word line groups; a power routing table configured to include power routing information indicating relationships between the plurality of word line groups and the plurality of power modules; and a control logic configured to perform an erase operation on the plurality of memory blocks, wherein the control logic sets the power routing table under control of an external controller such that a defective power module providing the voltages to two or more fail word line groups each included in a different fail block among fail blocks is changed to another power module among the plurality of power modules, and wherein the fail blocks are memory blocks among the memory blocks on which an erase operation has failed.

An embodiment of the present disclosure may provide for a memory controller configured to control a memory device including a plurality of memory blocks each including a plurality of word line groups each coupled to a plurality of memory cells; and a plurality of power modules configured to respectively provide voltages to the plurality of word line groups, the memory controller comprising: a fail block detector configured to detect a fail block including a fail word line on which an program operation has failed, among the plurality of memory blocks, and detect fail word line group including the fail word line, among a plurality of word line groups included in the fail block; a fail block manager configured to detect, among the plurality of power modules, a defective power module providing the voltages to two or more fail word line groups each included in a different fail block among a plurality of fail blocks; and a power defect controller configured to control the memory device such that the defective power module is changed to another power module among the plurality of power modules.

An embodiment of the present disclosure may provide for a memory device including: a memory cell array including a plurality of memory blocks each including a plurality of word line groups each coupled to a plurality of memory cells; a voltage generator including a plurality of power modules configured to respectively provide voltages to the plurality of word line groups; a power routing table configured to include power routing information indicating relationships between the plurality of word line groups and the plurality of power modules; and a control logic configured to perform a program operation on a plurality of word lines included in each of the plurality of memory blocks, wherein the control logic sets the power routing table under control of an external controller such that a defective power module providing the voltages to two or more fail word line groups each included in a different fail block among a plurality of fail blocks is changed to another power module among the plurality of power modules, and wherein a fail block includes a fail word line on which the program operation has failed, and wherein a fail word line group is a word line group including the fail word line, among the plurality of word line groups included in the fail block.

An embodiment of the present disclosure may provide for A memory system comprising: a memory device including: a plurality of memory blocks each coupled to a plurality of word line groups; and a plurality of power modules configured to provide one or more voltages to the memory blocks through the word line groups, respectively; and a controller configured to: control the memory device to perform data-change operations on the memory blocks by using the voltages; and control the memory device to replace a defective power module with a normal power module among the power modules, when the data-change operations fail on memory cells coupled to two or more fail word line groups within two or more fail blocks among the memory blocks and the fail word line groups each included in a different fail block among the fail blocks are provided with the voltages from the defective power module among the power modules.

BRIEF DESCRIPTION OF THE DRAWINGS

FIG. 10 is a diagram illustrating a fail block table configured to include the fail block information of FIG. 9.

FIG. 11 is a diagram illustrating power defect information indicating a word line group to which a defective power module provides a voltage, in accordance with an embodiment of the present disclosure.

FIG. 12 is a flowchart describing an operation of the memory controller in accordance with an embodiment of the present disclosure.

DETAILED DESCRIPTION

Figure 1:
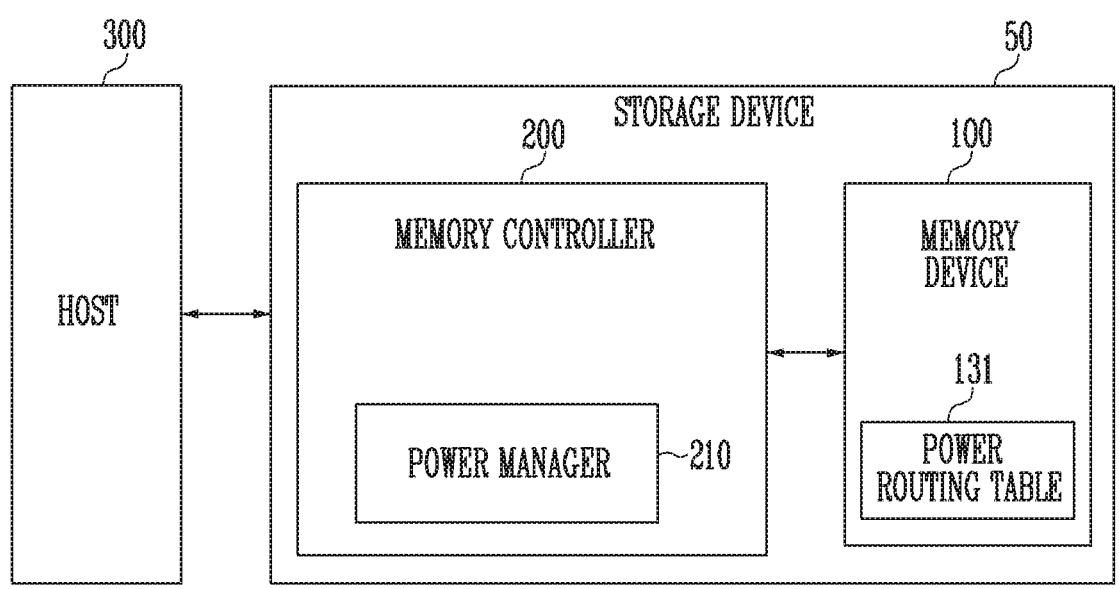
FIG. 1 is a diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure may be embodied in many different forms and should not be construed as being limited to only the embodiments set forth herein, but should be construed as covering modifications, equivalents or alternatives falling within ideas and technical scopes of the present invention. However, it is to be understood that the present description is not intended to limit the present disclosure to those exemplary embodiments, and the present disclosure is intended to cover not only the exemplary embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between," "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Hereinafter, the present disclosure will be described in detail by describing exemplary embodiments of the present disclosure with reference to the accompanying drawings. Hereinafter, embodiments of the present disclosure will be described in detail with reference to the attached drawings.

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be configured as any one of various types of storage devices depending on a host interface, which is a scheme for communicating with the host 300. For example, the storage device 50 may be configured as any one of various types of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, the memory device 100 is a NAND flash memory, however, other types of memory devices can be used.

The memory device 100 may receive a command and an address from the memory controller 200 and access a region of the memory cell array that is selected by the address. In other words, the memory device 100 may perform an operation corresponding to the command on the region selected by the address. For example, the memory device 100 may perform a write (program) operation, a read operation, and an erase operation. During a program operation, the memory device 100 may program data to a region selected by an address. During a read operation, the memory device 100 may read data from a region selected by an address. During an erase operation, the memory device 100 may erase data from a region selected by an address.

The memory device 100 may include a plurality of power modules. The plurality of power modules may respectively provide voltages to be applied to a plurality of word line groups included in each of the plurality of memory blocks. For example, each power module may provide a voltage to be applied to a corresponding one word line group included in each of the plurality of memory blocks. In an embodiment, each power module may provide voltages to be applied to two or more word lines groups.

In an embodiment, the memory device 100 may include a power routing table 131. The power routing table 131 may include power routing information indicating a corresponding relationship between the word line groups and the power modules. Each word line group may receive a voltage from the corresponding power module according to settings of the power routing table.

The memory controller 200 may control the overall operation of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data regardless of a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving manner so as to enhance the operating performance.

In an embodiment, the memory controller 200 may include a power Manager 210. The power manager 210 may implemented by using a firmware or a processor.

The power manager 210 may detect a fail block which is a memory block on which an erase operation or a program operation has failed among memory blocks on which the erase operation or the program operation has been performed.

In an embodiment, if an erase operation or a program operation performed by the memory device 100 has failed, the power manager 210 may detect a fail word line group among a plurality of word line groups included in a fail block. The power manager 210 may generate fail block information indicating whether each of the plurality of word line groups included in the fail block is the fail word line group.

The power manager 210 may detect a defect of a power module included in the memory device 100 using fail block information of at least two or more fail blocks. For example, when two or more fail word line groups each included in a different fail block are provided with voltages from the same power module, the power manager 210 may determine the power module as defective. The power manager 210 may generate power defect information indicating whether the power module that provides power to the two or more fail word line groups each included in a different fail block is a defective power module.

The power manager 210 may change the defective power module to a normal power module based on the generated power defect information. For example, the power manager 210 may set, based on the power defect information, the power routing table 131 stored in the memory device 100 so that the two or more fail word line groups that receives a voltage from the defective power module may receive a voltage from the normal power module.

The power manager 210 may provide, to the memory device 100, a set parameter command of setting the power routing table 131 such that the two or more fail word line groups that receives a voltage from the defective power module may receive a voltage form the normal power module.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
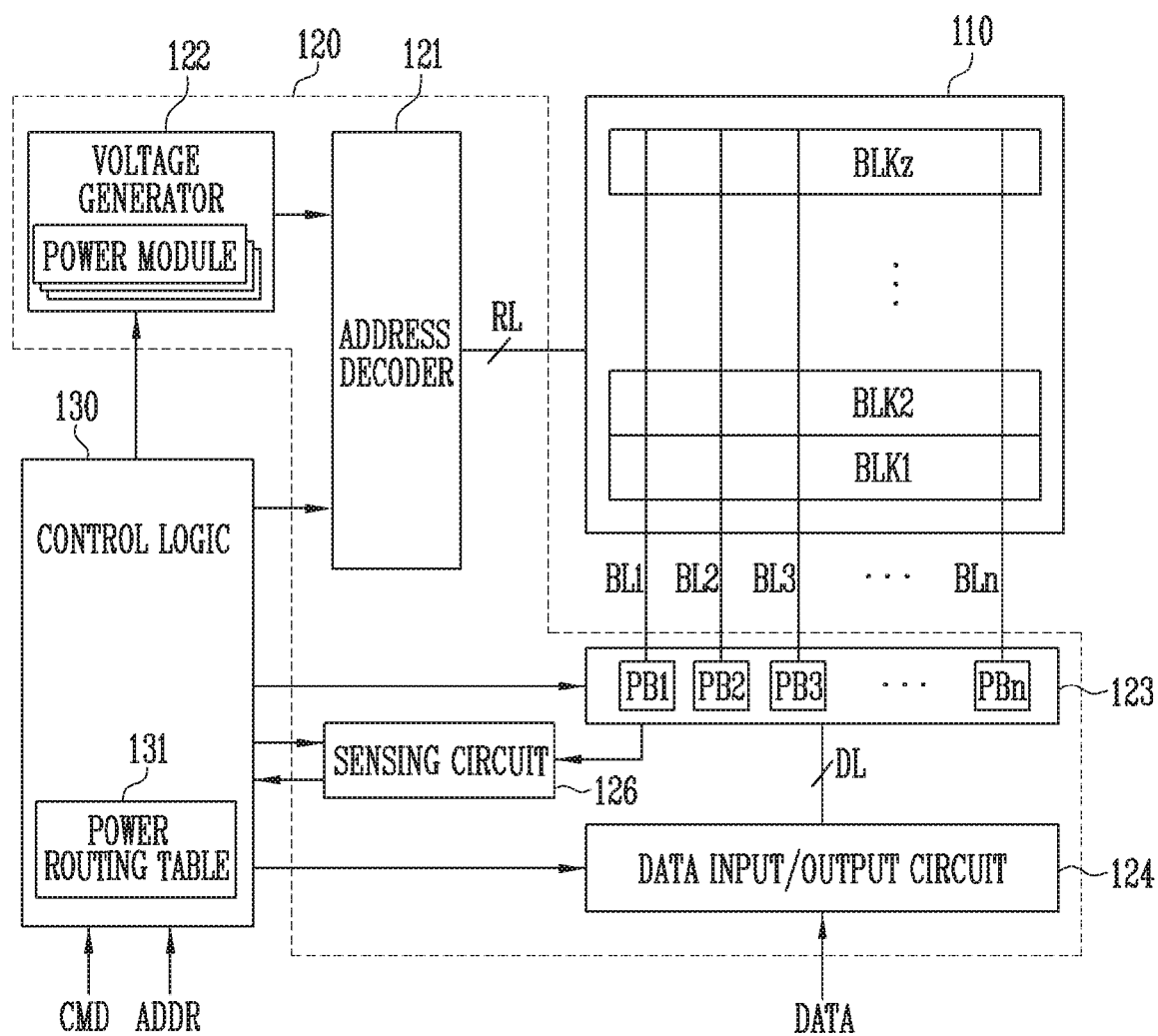
FIG. 2 is a diagram illustrating the configuration of a memory device of FIG. 1.

FIG. 2 is a diagram illustrating the configuration of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to an address decoder 121 through row lines RL. The memory blocks BLK1 to BLKz may be coupled to the read/write circuit 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages. In an embodiment, each of the memory blocks BLK1 to BLKz included in the memory cell array 110 may include a plurality of dummy cells. Here, one or more dummy cells may be coupled in series between a drain select transistor and the memory cells, and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, a data input/output circuit 124, and a sensing circuit 126.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to at least one word line WL according to the decoded row address.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage to a selected word line and apply a read pass voltage higher than the read voltage to unselected word lines.

In an embodiment of the present disclosure, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of voltages using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using an external supply voltage or an internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, for generating a plurality of voltages having various voltage levels, a plurality of pumping capacitors configured to receive an internal supply voltage, and may generate a plurality of voltages by selectively enabling the plurality of pumping capacitors under control of the control logic 130.

The generated voltages may be supplied to the memory cell array 110 by the address decoder 121.

The voltage generator 122 may include a plurality of power modules. Each power module may provide a voltage to be applied to a corresponding one word line group included in each of the plurality of memory blocks. In an embodiment, each power module may provide voltages to be applied to two or more word lines groups.

The number of power modules may be greater than or equal to the number of word line groups included in a memory block. A power module which does not provide a voltage to be applied to a word line group may be an extra power module.

The read/write circuit 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130.

The first to n-th page buffers PB1 to PBn may perform data communication with the data input/output circuit 124. During a program operation, the first to n-th page buffers PB1 to PBn may receive data to be stored through the data input/output circuit 124 and data lines DL.

During a program operation, the first to n-th page buffers PB1 to PBn may transmit the data, received through the data input/output circuit 124, to selected memory cells through the bit lines BL1 to BLn when a program pulse is applied to a selected word line. The memory cells in the selected page are programmed based on the transmitted data. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to n-th page buffers PB1 to PBn may read data from selected memory cells through the bit lines BL1 to BLn to determine whether the threshold voltages of the memory cells exceed a verify voltage.

During a read operation, the read/write circuit 123 may read data from the memory cells of the selected page through the bit lines BL, and store the read data to the first to n-th page buffers PB1 to PBn.

During an erase operation, the read/write circuit 123 may float the bit lines BL. In an embodiment, the read/write circuit 123 may include a column select circuit.

The data input/output circuit 124 is coupled to the first to n-th page buffers PB1 to PBn through the data lines DL. The data input/output circuit 124 may operate under control of the control logic 130.

The data input/output circuit 124 may include a plurality of input/output buffers (not shown) for receiving inputted data. During a program operation, the data input/output circuit 124 may receive data to be stored from an external controller (not shown). During a read operation, the data input/output circuit 124 may output, to the external controller, data received from the first to n-th page buffers PB1 to PBn included in the read/write circuit 123.

During a read operation or a verify operation, the sensing circuit 126 may generate reference current in response to an enable bit signal generated by the control logic 130, compare a sensing voltage received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 126. The control logic 130 may control the overall operation of the memory device 100. The control logic 130 may operate in response to a command CMD transmitted from an external device.

The control circuit 130 may generate various signals in response to the command CMD and the address ADD, and control the peripheral circuits 120. For example, the control logic 130 may generate an operating signal, a row address, a read/write circuit control signal, and an enable bit in response to the command CMD and the address ADD. The control logic 130 may output the operating signal to the voltage generator 122, output the row address to the address decoder 121, output the read/write control signal to the read/write circuit 123, and output the enable bit to the sensing circuit 126. Furthermore, the control logic 130 may determine whether target memory cells have passed or failed a verification during the verify operation in response to a pass signal or a fail signal that is output from the sensing circuit 126.

In an embodiment, the control logic 130 may include the power routing table 131. The power routing table 131 may include power routing information indicating a corresponding relationship between the word line groups and the power modules. The control logic 130 may change the power routing information included in the power routing table 131 according to a set parameter command received from the memory controller described with reference to FIG. 1.

In an embodiment, the control logic 130 may store the changed power routing information in a system block. The system block may be a memory block allocated to store system information needed to drive the memory device 100 and the memory controller described with reference to FIG. 1.

The control logic 130 may control the voltage generator 122 such that the plurality of power modules respectively provide voltages to be applied to the plurality of word line groups included in each of the plurality of memory blocks.

Figure 3:
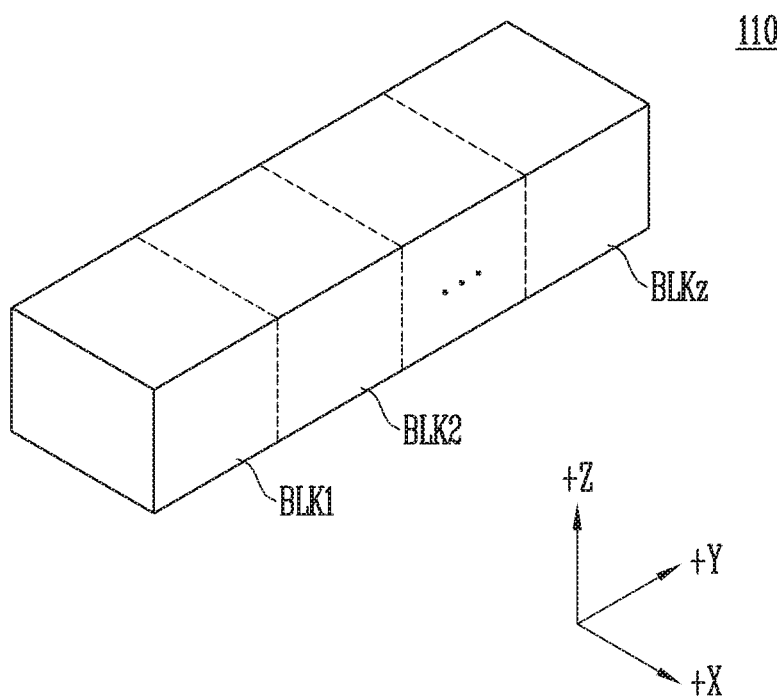
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
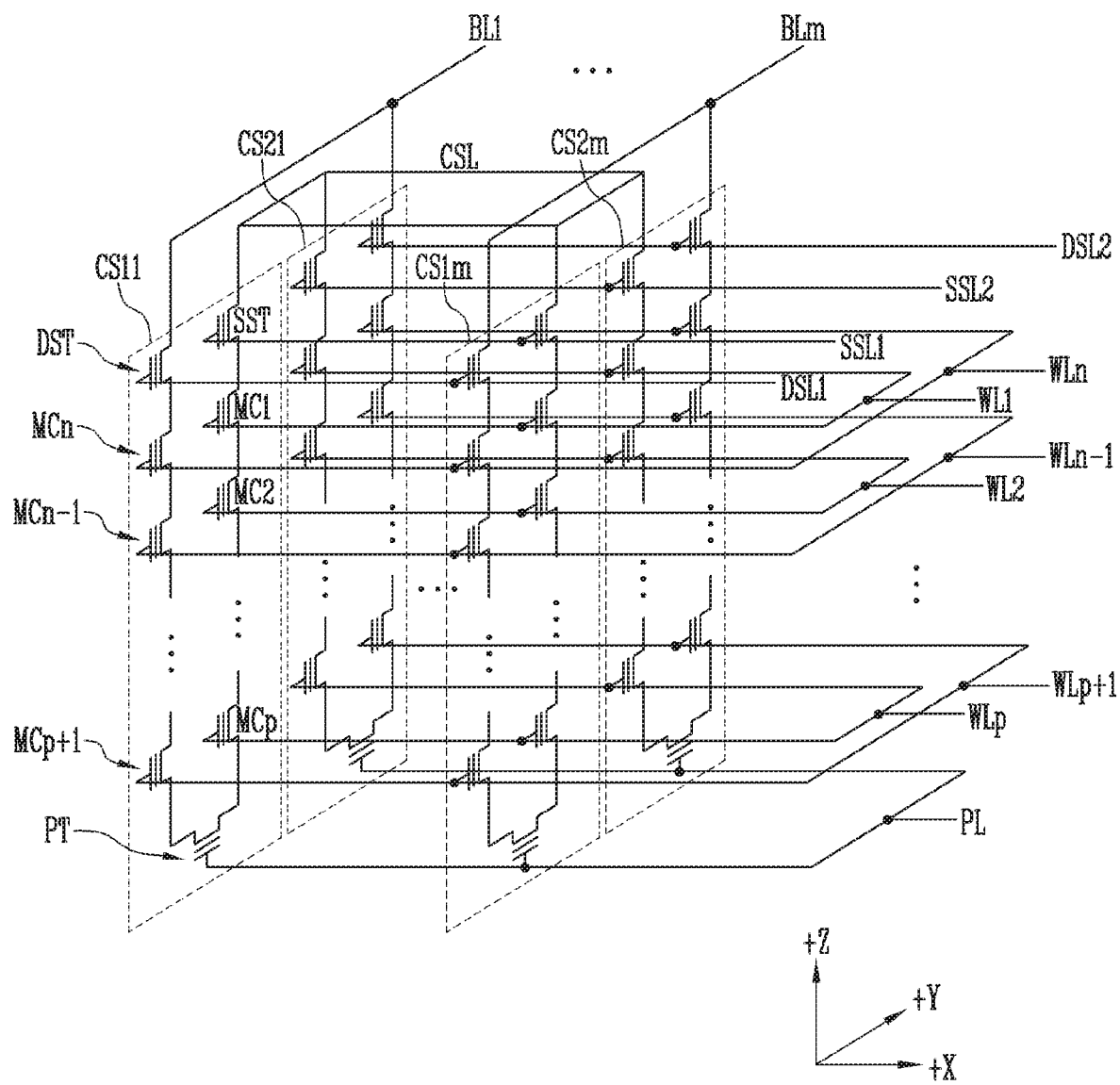
FIG. 4 is a circuit diagram illustrating any one memory block BLKa of memory blocks BLK1 to BLKz of FIG. 3, in accordance with an embodiment of the present disclosure.

FIG. 4 is a circuit diagram illustrating any one memory block BLKa of memory blocks BLK1 to BLKz of FIG. 3, in accordance with an embodiment of the present disclosure.

Figure 5:
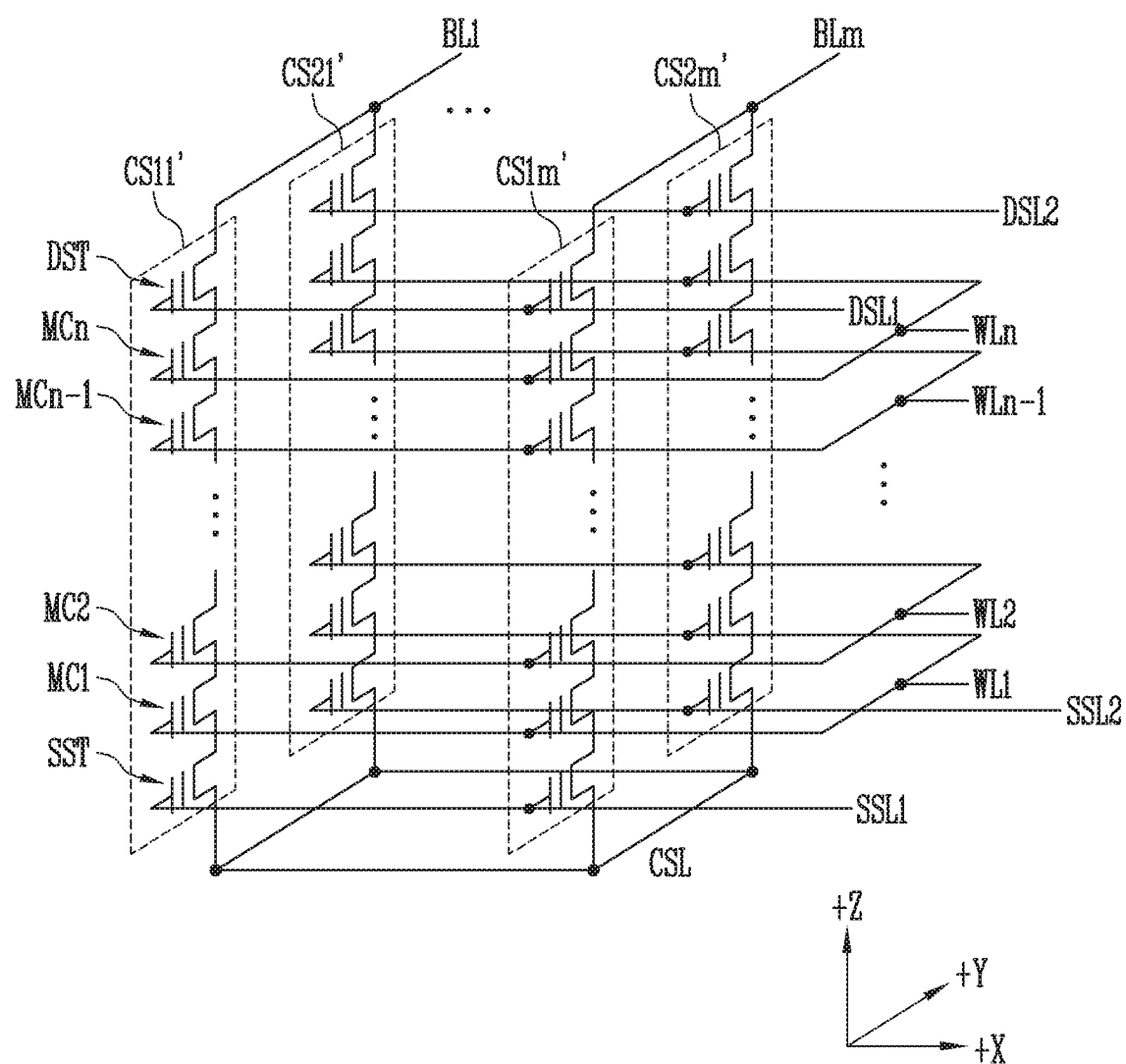
FIG. 5 is a circuit diagram illustrating any one memory block BLKb of the memory blocks BLK1 to BLKz of FIG. 3, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 5, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to the respective even bit lines. Odd-number-th cell strings of the cell strings CS11 to CS1m or CS21 to CS2m arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one or more dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

FIG. 5 is a circuit diagram illustrating any one memory block BLKb of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one or more dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figures 6, 7:
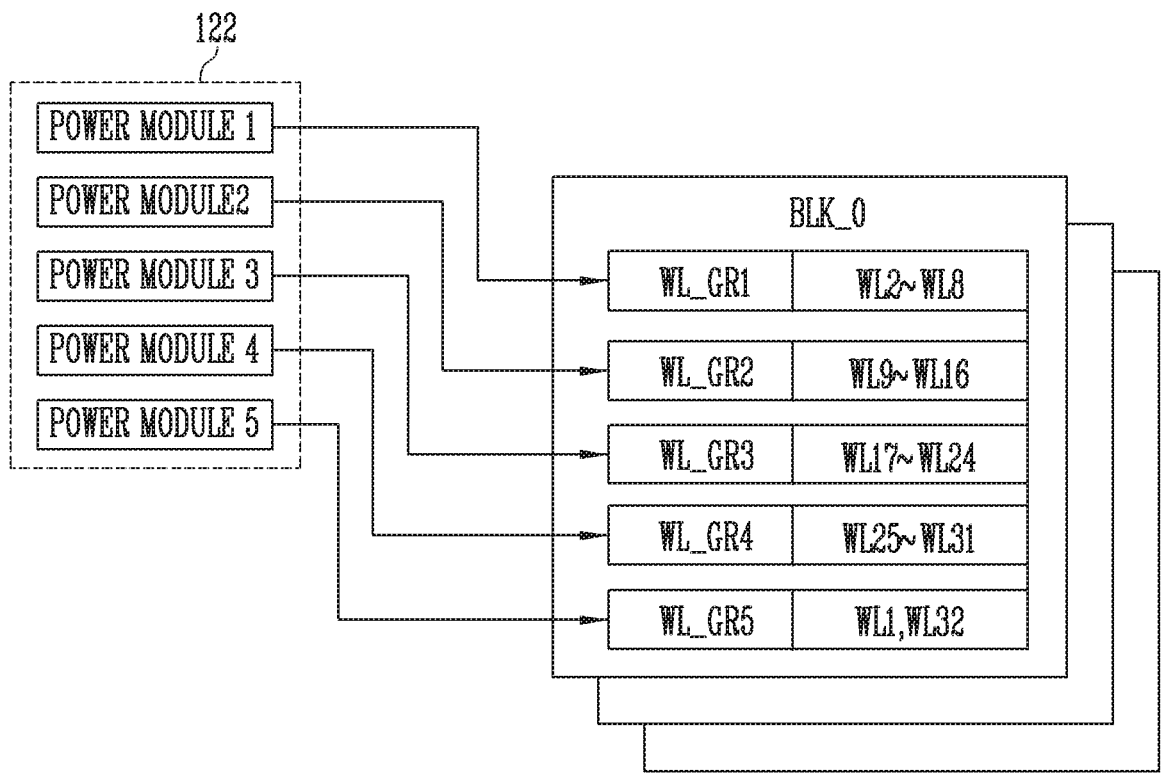
FIG. 6 is a diagram illustrating a corresponding relationship between power modules and word line groups included in the memory device, in accordance with an embodiment of the present disclosure.
FIG. 7 is a diagram illustrating a power routing table configured to include power routing information indicating the corresponding relationship between the word line groups and the power modules, in accordance with an embodiment of the present disclosure.

FIG. 6 is a diagram illustrating a corresponding relationship between power modules and word line groups included in the memory device, in accordance with an embodiment of the present disclosure.

Referring to FIG. 6, the voltage generator 122 may include a plurality of power modules. Each power module may provide a voltage to be applied to a corresponding one word line group included in each of the plurality of memory blocks. In an embodiment, each power module may provide voltages to be applied to two or more word lines groups.

The number of power modules may be greater than or equal to the number of word line groups included in the memory block. A power module which does not provide a voltage to be applied to a word line group may be an extra power module. The number of power modules included in the voltage generator 122 is not limited to that of this embodiment.

Each of the memory blocks may include a plurality of word lines. The plurality of word lines included in each memory block may be divided into a plurality of word line groups. Each of the word line groups may include a plurality of word lines. The number of word lines included in each memory block, the number of word line groups included in the memory block, and the number of word lines included in each word line group are not limited to those of this embodiment.

Various criteria may be used to divide the plurality of word lines included in each memory block into a plurality of word line groups. The criteria may be a position of each word line, a sequence along which the word lines are programmed, or the number of word lines included in each word line group.

A corresponding relationship between the word line groups and the power modules will be described based on a zeroth memory block BLK_0 of the plurality of memory blocks. The corresponding relationship may be applied to the other memory blocks of the plurality of memory blocks in the same manner.

In FIG. 6, the voltage generator 122 may include first to fifth power modules (i.e., power module 1 to power module 5). The zeroth memory block BLK_0 may include first to thirty-second word lines WL1 to WL32. The first to thirty-second word lines WL1 to WL32 may be divided into first to fifth word line groups WL_GR1 to WL_GR5.

The first word line group WL_GR1 may include second to eighth word lines WL2 to WL8. The second word line group WL_GR2 may include ninth to sixteenth word lines WL9 to WL16. The third word line group WL_GR3 may include seventeenth to twenty-fourth word lines WL17 to WL24. The fourth word line group WL_GR4 may include twenty-fifth to thirty-first word lines WL25 to WL31. The fifth word line group WL_GR5 may include first and thirty-second word lines WL1 and WL32.

The first power module 1 to fifth power module 5 may respectively correspond to the first to fifth word line groups WL_GR1 to WL_GR5 of the zeroth memory block BLK_0. The first power module 1 to fifth power module 5 may respectively provide voltages to be applied to the corresponding first to fifth word line groups WL_GR1 to WL_GR5 of the zeroth memory block BLK_0. For example, the first power module 1 to fifth power module 5 may also respectively provide voltages to be applied to the corresponding first to fifth word line groups WL_GR1 to WL_GR5 within each of the remaining memory blocks.

FIG. 7 is a diagram illustrating the power routing table 131 configured to include power routing information indicating the corresponding relationship between the word line groups and the power modules, in accordance with an embodiment of the present disclosure.

Referring to FIGS. 1 and 7, the power routing information included in the power routing table 131 may be changed according to a set parameter command transmitted from the memory controller 200 to the memory device 100. The plurality of power modules may be controlled to respectively provide voltages to be applied to the plurality of word line groups included in each of the plurality of memory blocks based on the power routing table 131.

The number of power modules and the number of word line groups that are indicated by the power routing information are not limited to those of this embodiment. The number of word lines included in each memory block, the number of word line groups included in the memory block, and the number of word lines included in each word line group are not limited to those of this embodiment.

Referring to FIG. 7, the power routing table 131 may include power routing information indicating the corresponding relationship between the first to fifth power modules Power Module_1 to Power Module_5 and the first to fifth word line groups WL_GR1 to WL_GR5.

A plurality of word lines included in each memory block may be first to thirty-second word lines WL1 to WL32. The first word line WL1 may be a word line adjacent to the source select line SSL, and the thirty-second word lines WL32 may be a word line adjacent to the drain select line DSL. Alternatively, in a three-dimensional memory block structure, the thirty-second word line WL32 may be a word line adjacent to the source select line SSL. In an embodiment, the first word line WL1 and the thirty-second word line WL32 may be edge word lines, and the other word lines may be normal word lines. In the embodiment of FIG. 7, the memory device 100 may separately manage a power module configured to apply a voltage to the edge word lines.

In an embodiment, the first word line group WL_GR1 may include the second to eighth word lines WL2 to WL8. The second word line group WL_GR2 may include the ninth to sixteenth word lines WL9 to WL16. The third word line group WL_GR3 may include the seventeenth to twenty-fourth word lines WL17 to WL24. The fourth word line group WL_GR4 may include the twenty-fifth to thirty-first word lines WL25 to WL31. The fifth word line group WL_GR5 may include the first and thirty-second word lines WL1 and WL32.

The first to fifth power modules Power Module_1 to Power Module_5 may respectively provide voltages to be applied to the first to fifth word line groups WL_GR1 to WL_GR5 under control of the memory device 100. The memory device 100 may separately manage the fifth power module Power Module_5 configured to provide a voltage applied to the fifth word line group WL_GR5 including the first word line WL1 and the thirty-second word line WL32 that are edge word lines.

In accordance with an embodiment of the present disclosure, the first to fifth power modules Power Module 1 to Power Module 5 may provide voltages to each of the plurality of memory blocks according to the power routing table 131 having a plurality of word line groups of a single memory block, which means that a single power module may provide a voltage to a plurality of word line groups included in different memory blocks.

Figures 8, 9:
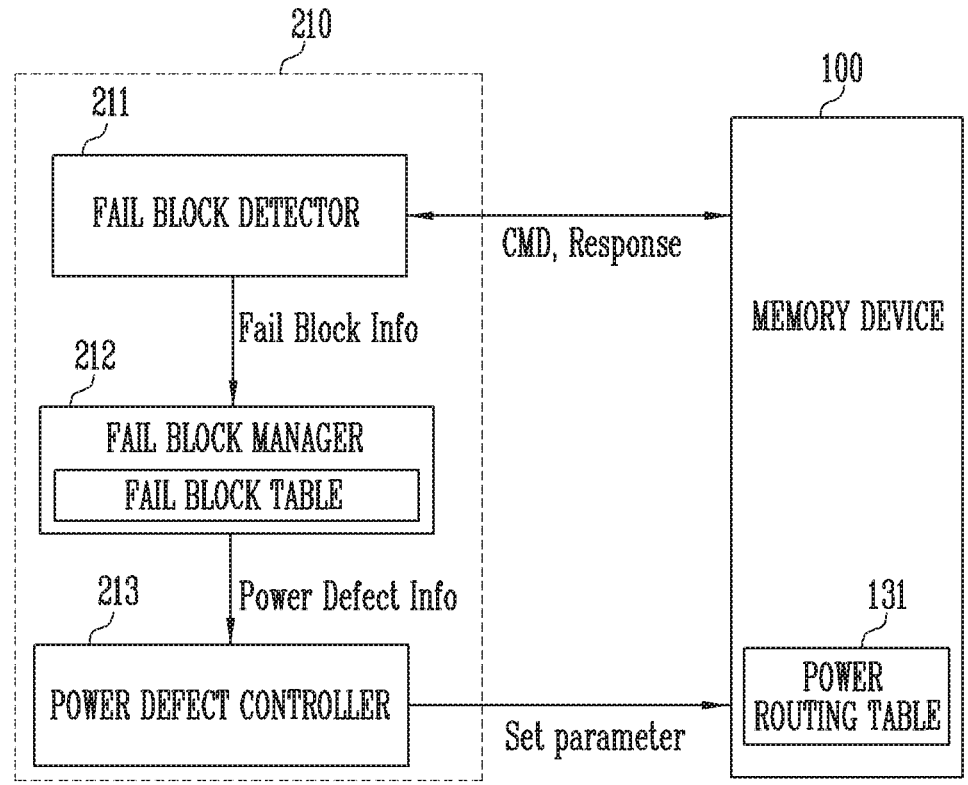
FIG. 8 is a diagram illustrating an operation of a memory controller in accordance with an embodiment of the present disclosure.
FIG. 9 is a diagram illustrating fail block information indicating whether each of a plurality of word line groups included in a fail block is a fail word line group in accordance with an embodiment of the present disclosure.

FIG. 8 is a diagram illustrating the operation of the memory controller 200 in accordance with an embodiment of the present disclosure.

Referring to FIG. 8, the memory device 100 may include the power routing table 131.

The power routing table 131 may include the power routing information indicating a corresponding relationship between the word line groups and the power modules, as described with reference to FIGS. 6 and 7. The power routing information included in the power routing table 131 may be changed according to a set parameter command transmitted from the memory controller 200 to the memory device 100.

The plurality of power modules may be controlled to respectively provide voltages to be applied to the plurality of word line groups included in each of the plurality of memory blocks based on the power routing table 131.

The power manager 210 may include a fail block detector 211, a fail block manger 212, and a power defect controller 213.

In an embodiment, the fail block detector 211 may detect a fail block which is a memory block on which an erase operation has failed among memory blocks on which the erase operation has been performed. The fail block may be a memory block on which an erase verify operation for the erase operation has failed. The erase verify operation may be an operation of applying an erase verify voltage to word lines belonging to a selected region and reading corresponding memory cells. Pass or fail of the erase verify operation may be determined depending on the number of fail bits that indicates the number of memory cells having threshold voltages higher than the erase verify voltage among the memory cells included in the selected region. If the number of fail bits exceeds a preset value, the erase verify operation may fail. The erase verify voltage may be a ground voltage. The erase verify voltage may be a negative voltage, 0 V, or a positive voltage.

In other words, the fail block may be a memory block in which the number of fail bits exceeds a preset value as a result of the erase verify operation of applying the erase verify voltage to the word lines coupled to the fail block and reading the corresponding memory cells.

The fail block detector 211 may perform, if a fail block is detected, an erase verify operation on each of a plurality of word line groups included in the fail block. Alternatively, an erase verify operation may be performed on each of a plurality of word lines included in the fail block.

Pass or fail of an erase verify operation on a word line group or a word line may be determined depending on the number of fail bits that indicates the number of memory cells having threshold voltages higher than the erase verify voltage among memory cells included in the word line group or the word line. A word line group in which the number of fail bits exceeds a preset value may be a fail word line group. A word line in which the number of fail bits exceeds a preset value may be a fail word line.

The fail block detector 211 may generate fail block information Fail Block Info indicating whether each of the plurality of word line groups included in the fail block is a fail word line group. The fail block detector 211 may provide the generated fail block information Fail Block Info to the fail block manager 212.

In an embodiment, the fail block detector 211 may detect a fail block which is a memory block including a word line on which a program verify operation has failed. The program verify operation may be an operation of applying a program verify voltage to a selected word line and reading corresponding memory cells. Pass or fail of the program verify operation may be determined depending on the number of fail bits that indicates the number of memory cells having threshold voltages lower than the program verify voltage among the memory cells included in the selected word line. If the number of fail bits exceeds a preset value, the program verify operation may fail. The program verify voltage may be a preset voltage. The program verify voltage may be a negative voltage, 0 V, or a positive voltage. Unless the program verify operation passes within a predetermined program loop, the program operation may fail.

If a fail block which is a memory block including a word line on which a program verify operation has failed is detected, the fail block detector 211 may detect a fail word line group which is a word line group including the word line on which the program verify operation has failed among the plurality of word line groups included in the fail block.

The fail block detector 211 may generate fail block information Fail Block Info indicating whether each of the plurality of word line groups included in the fail block is a fail word line group. The fail block detector 211 may provide the generated fail block information Fail Block Info to the fail block manager 212.

The fail block manger 212 may include a fail block table for storing the fail block information Fail Block Info provided from the fail block detector 211.

The fail block manager 212 may detect a defective power module among the plurality of power modules depending on whether two or more fail word line groups each included in a different fail block are provided with voltages from the same power module.

Based on the fail block table, if two or more fail word line groups each included in a different fail block are provided with voltages from the same power module, the fail block manager 212 may generate power defect information Power Defect Info. The power defect information Power Defect Info may be information indicating whether a power module that provides power to the two or more fail word line groups each included in a different fail block is a defective power module. The fail block manager 212 may determine that the power module that provides power to the two or more fail word line groups each included in a different fail block is a defective power module.

The fail block manager 212 may provide the power defect information Power Defect Info generated based on the fail block table to the power defect controller 213.

The power defect controller 213 may change the voltage supply to the two or more fail word line groups each included in a different fail block from the defective power module to a normal power module based on the received power defect information Power Defect Info. In detail, the power defect controller 213 may set the power routing table such that the power module that provides voltages to be applied to the two or more fail word line groups each included in a different fail block is changed to a normal power module. The power defect controller 213 may provide a set parameter command to the memory device 100 to change the power routing information. The fail block detector 211, the fail block manager 212, and the power detect controller 213 may be implemented by using a firmware or a processor, respectively. Further, the fail block manager 212 may be implemented by using a firmware or a processor including an internal storage.

The normal power module may be a power module different from the defective power module among the plurality of power modules. In an embodiment, the normal power module may be a power module that provides a voltage to any one word line group other than the fail word line group. In an embodiment, the normal power module may be a power module that provides voltages to be applied to word line groups that are different from and adjacent to the at least one fail word line groups that correspond to each other among the plurality of word line groups. Alternatively, the normal power module may be an extra power module that does not provide a voltage to be applied to a word line group among the plurality of power modules.

In an embodiment, the normal power module may be a power module that provides a voltage to be applied to a word line group that has passed an erase verity operation among the plurality of word line groups included in the memory device 100.

FIG. 9 is a diagram illustrating fail block information indicating whether each of a plurality of word line groups included in a fail block is a fail word line group in accordance with an embodiment of the present disclosure.

Fail block information of the memory block BLK_1 that is a fail block among memory blocks on which an erase operation has been performed will be described with reference to FIG. 9. The memory block BLK_1 may include the first to fifth word line groups WL_GR1 to WL_GR5. Each of the first word line group WL_GR1 and the third to fifth word line groups WL_GR3 to WL_GR5 may be a word line group on which an erase verify operation has passed.

The second word line group WL_GR2 may be a fail word line group which is a word line group on which the erase verify operation has failed. Here, at least one word line among the ninth to sixteenth word lines WL9 to WL16 included in the second word line group WL_GR2 may be a word line on which the erase verify operation has failed.

The fail word line may be a word line in which the number of fail bits exceeds a preset value as a result of the erase verify operation of applying an erase verify voltage to the word line and reading the corresponding memory cells.

In an embodiment of the present disclosure, a fail block may be a memory block including a word line on which a program operation has failed. The word line on which the program operation has failed may be a word line on which a program verify operation for the program operation has failed. Here, the program verify operation may be an operation of applying a program verify voltage to a selected word line and reading corresponding memory cells. Pass or fail of the program verify operation may be determined depending on the number of fail bits that indicates the number of memory cells having threshold voltages lower than the program verify voltage among the memory cells included in the selected word line. If the number of fail bits exceeds a preset value, the program verify operation may fail.

Fail block information of the memory block BLK_1 that corresponds to a fail block which is a memory block including a word line on which the program operation has failed will be described with reference to FIG. 9. The memory block BLK_1 may include the first to fifth word line groups WL_GR1 to WL_GR5.

For example, if a program operation has failed on the ninth word line WL9 among the word lines belonging to the second word line group WL_GR2, the second word line group WL_GR2 may be determined to be a fail word line group.

FIG. 10 is a diagram illustrating the fail block table configured to include the fail block information of FIG. 9.

Referring to FIG. 10, the fail block table may include fail block information of memory blocks that are fail blocks. The fail block table may be stored in the fail block manager 212 described with reference to FIG. 8. The number of pieces of fail block information of the memory blocks included in the fail block table is not limited to this embodiment.

In an embodiment of the present disclosure, a fail block may be a memory block on which an erase operation has failed. A fail word line group may be a word line group on which an erase verify operation has failed. At least one word line included in a word line group corresponding to the fail word line group may be a word line on which an erase verify operation has failed.

In an embodiment of the present disclosure, a fail block may be a memory block including a word line on which a program operation has failed. A fail word line group may be a word line group including a word line on which a program operation has failed. The word line on which the program operation has failed may be a word line on which a program verify operation for the program operation has failed.

Referring to FIG. 10, the fail block table may include fail block information of a first memory block BLK_1, fail block information of a third memory block BLK_3, and fail block information of an i-th memory block BLK_i (i is a positive integer of 3 or more).

The fail block information of the first memory block BLK_1 indicates that a second word line group WL_GR2 of first to fifth word line groups WL_GR1 to WL_GR5 included in the first memory block BLK_1 is a fail word line group. The fail block information of the third memory block BLK_3 indicates that a second word line group WL_GR2 of first to fifth word line groups WL_GR1 to WL_GR5 included in the third memory block BLK_3 is a fail word line group. The fail block information of the i-th memory block BLK_i indicates that a fourth word line group WL_GR4 of first to fifth word line groups WL_GR1 to WL_GR5 included in the i-th memory block BLK_i is a fail word line group.

FIG. 11 is a diagram illustrating power defect information indicating a word line group to which a defective power module provides a voltage, in accordance with an embodiment of the present disclosure.

Referring to FIG. 11, the power defect information may be information indicating that, when two or more fail word line groups each included in a different fail block are provided with voltages from the same power module, the same power module that provides power to the two or more fail word line groups each included in a different fail block is a defective power module. The power defect information may be generated by the fail block manager 212 based on the fail block table.

FIG. 12 is a flowchart describing an operation of the memory controller 200 in accordance with an embodiment of the present disclosure.

Referring to FIG. 12, at step S1201, the memory controller 200 may provide an erase command for memory blocks to the memory device 100.

At step S1203, the memory controller 200 may determine whether an erase operation on the memory blocks has failed. As a result of the determination, if the erase operation has failed, the process proceeds to step S1205, and if not, the process ends. If an erase verify operation on a memory block on which the erase operation has been performed fails, the memory controller 200 may determine that the erase operation on the memory block has failed.

At step S1205, the memory controller 200 may determine whether the erase operation on each of the word line groups included in the fail block has failed. The fail block may be a memory block on which the erase operation has failed.

At step S1207, the memory controller 200 may generate fail block information Fail Block Info based on a result of the determination of step S1205, and store the generated fail block information Fail Block Info into the fail block table of the fail block manager 212. The fail block information Fail Block Info may be information indicating whether each of the word line groups included in the fail block is a fail word line group.

At step 1209, the memory controller 200 may determine whether generation of fail block information for all fail blocks has been completed. As a result of the determination, if the generation of fail block information Fail Block Info for all of the fail blocks has been completed, the process ends, and if not, the process proceeds to step S1203.

Figure 13:
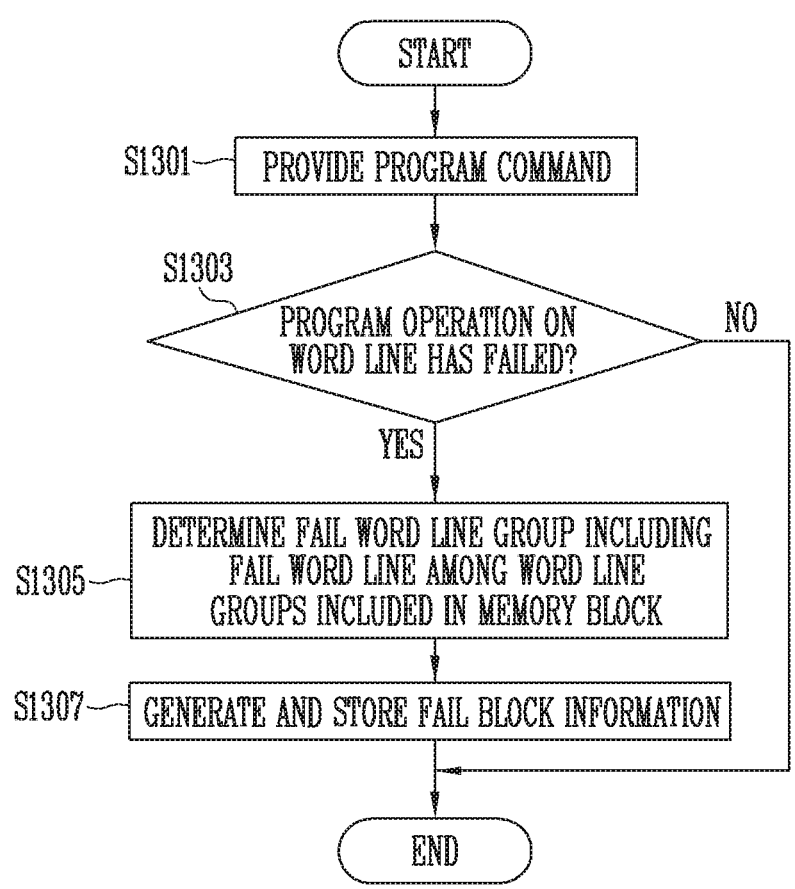
FIG. 13 is a flowchart describing an operation of the memory controller in accordance with an embodiment of the present disclosure.

FIG. 13 is a flowchart describing an operation of the memory controller 200 in accordance with an embodiment of the present disclosure.

Referring to FIG. 13, at step S1301, the memory controller 200 may provide a program command for a plurality of word lines included in memory blocks to the memory device 100. In detail, the memory controller 200 may provide at least one program command to the memory device 100 so that the memory device 100 performs a program operation on at least two or more memory blocks.

At step S1303, the memory controller 200 may determine whether the program operation performed on word lines in response to the program command has failed. As a result of the determination, if the program operation has failed, the process proceeds to step S1305, and if not, the process ends.

At step S1305, the memory controller 200 may determine a fail word line group including a fail word line among word line groups included in a memory block on which the program operation has been performed.

At least one word line among the word lines included in the fail word line group may be a fail word line. The fail word line may be a word line on which a program verify operation for the program operation has failed.

At step S1307, the memory controller 200 may generate fail block information Fail Block Info based on a result of the determination of step S1305, and store the generated fail block information Fail Block Info into the fail block table of the fail block manager 212.

Figure 14:
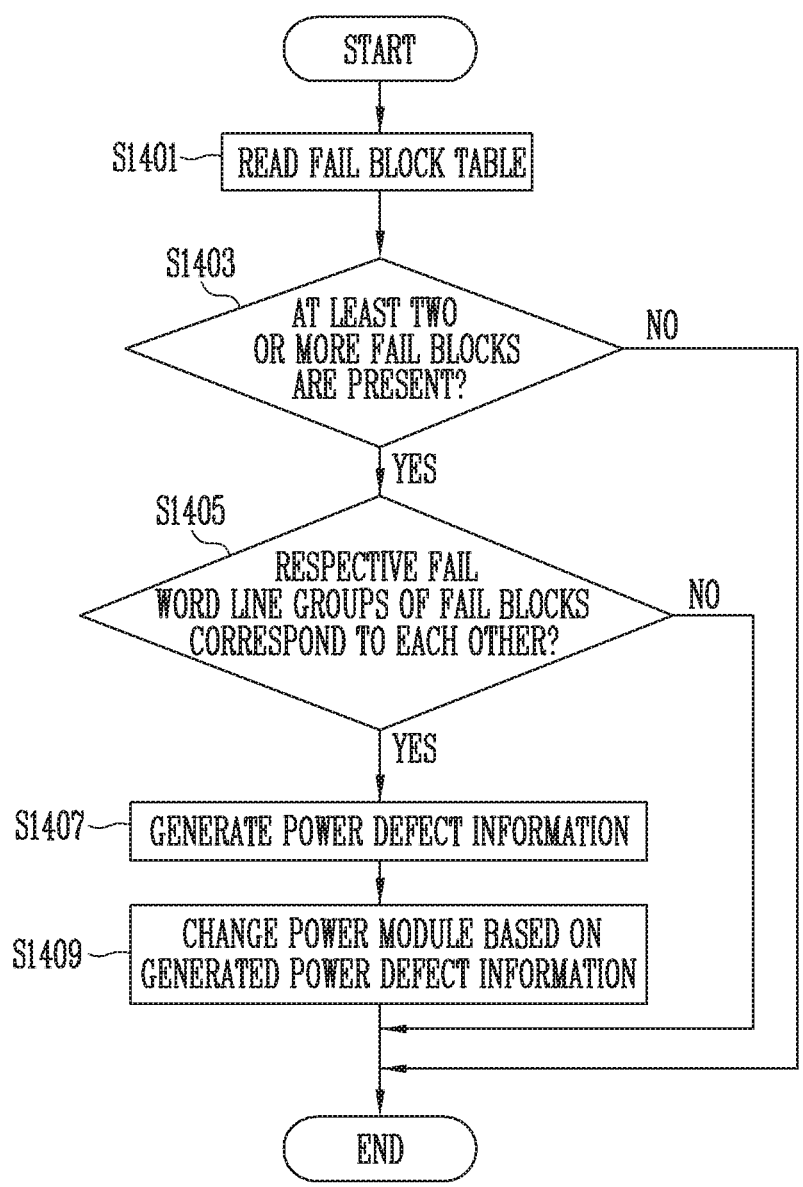
FIG. 14 is a flowchart describing an operation of the memory controller in accordance with an embodiment of the present disclosure.

FIG. 14 is a flowchart describing an operation of the memory controller 200 in accordance with an embodiment of the present disclosure.

Referring to FIG. 14, at step S1401, the memory controller 200 may read the fail block table that stores the fail block information Fail Block Info within the fail block manager 212.

At step S1403, the memory controller 200 may determine whether information of at least two or more fail blocks is included in the fail block table. As a result of the determination, if information of at least two or more fail blocks is included in the fail block table, the process proceeds to step S1405, and if not, the process ends.

At step S1405, the memory controller 200 may determine whether fail word line groups respectively included in the fail blocks correspond to each other with reference to the power modules. In detail, the memory controller 200 may determine whether two or more fail word line groups each included in a different fail block are provided with voltages from the same power module. As a result of the determination, if two or more fail word line groups each included in a different fail block are provided with voltages from the same power module, the process proceeds to step S1407, and if not, the process ends.

At step S1407, the memory controller 200 may generate power defect information indicating whether the same power module that provides power to the two or more fail word line groups each included in a different fail block is a defective power module.

At step S1409, the memory controller 200 may change the defective power module that provides power to be applied to the two or more fail word line groups each included in a different fail block based on the generated power defect information.

Figure 15:
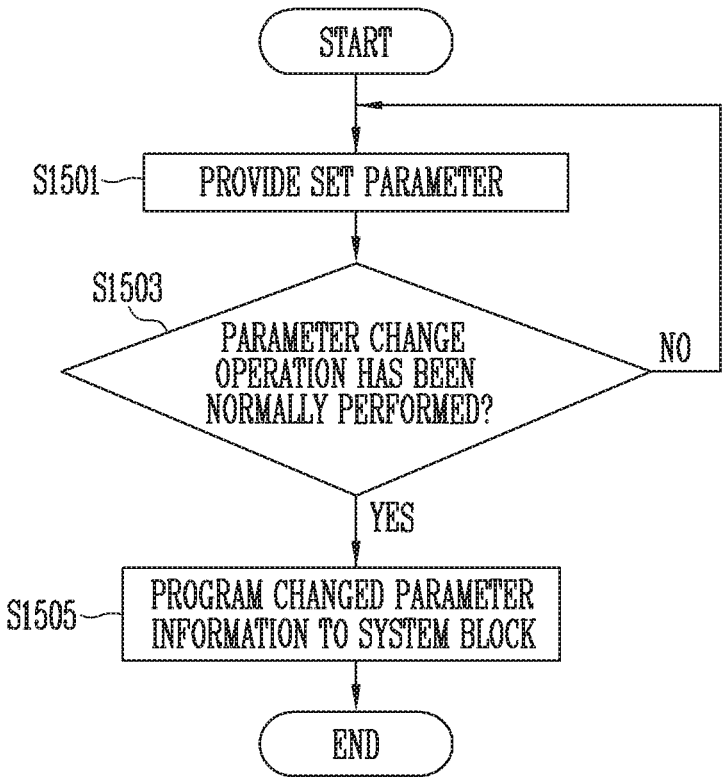
FIG. 15 is a flowchart describing an operation of the memory controller in accordance with an embodiment of the present disclosure.

FIG. 15 is a flowchart describing an operation of the memory controller 200 in accordance with an embodiment of the present disclosure.

Referring to FIG. 15, at step S1501, the memory controller 200 may provide, to the memory device 100, a set parameter command for changing the defective power module to a normal power module based on the power defect information.

At step S1503, the memory controller 200 may provide a set parameter command to the memory device 100, receive a response to the set parameter command from the memory device 100, and determine whether a parameter change operation according to the set parameter command has been normally performed. As a result of the determination, if the parameter change operation has been normally performed, the process proceeds to step S1505, and if not, the process proceeds to step S1501.

At step S1505, the memory controller 200 may provide a program command to the memory device 100 so that the memory device 100 stores changed parameter information in the system block.

Figure 16:
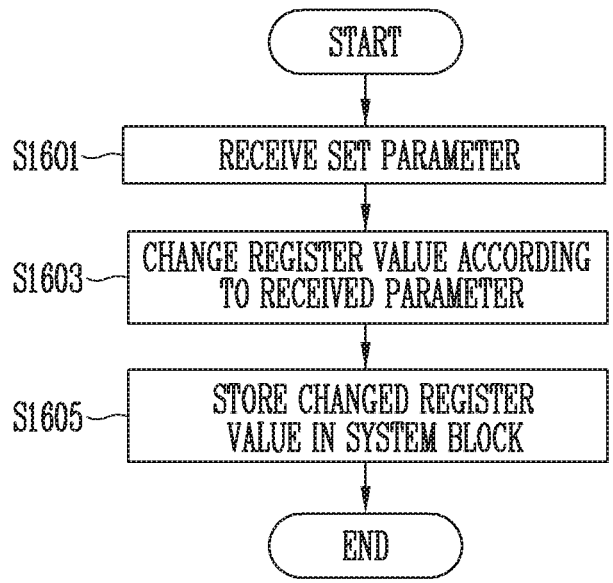
FIG. 16 is a flowchart describing an operation of the memory device in accordance with an embodiment of the present disclosure.

FIG. 16 is a flowchart describing an operation of the memory device 100 in accordance with an embodiment of the present disclosure.

Referring to FIG. 16, at step S1601, the memory device 100 may receive, from the memory controller 200, a set parameter command for replacing a defective power module with a normal power module.

At step S1603, the memory device 100 may change a register value stored in a volatile memory according to the received set parameter command. The memory device 100 may control the power modules to respectively provide voltages to be applied to the corresponding word line groups according to the changed register value.

At step S1605, the memory device 100 may receive a program command provided from the memory controller 200 and store the changed register value in the system block.

Figure 17:
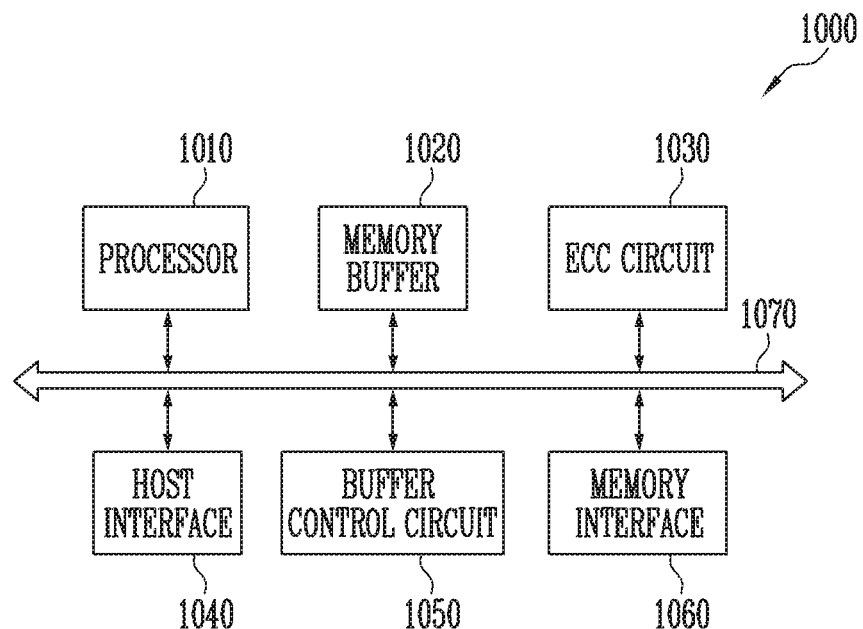
FIG. 17 is a diagram illustrating a memory controller of FIG. 1 in accordance with an embodiment of the present disclosure.

FIG. 17 is a diagram illustrating a memory controller of FIG. 1 in accordance with an embodiment of the present disclosure.

Referring to FIG. 17, the memory controller 1000 is coupled to a host and the memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 18:
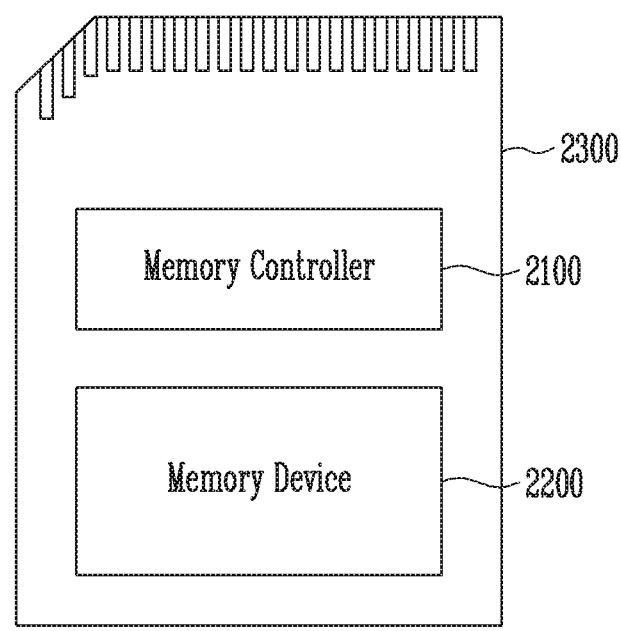
FIG. 18 is a block diagram illustrating a memory card system to which the storage device in accordance with an embodiment of the present disclosure is applied.

FIG. 18 is a block diagram illustrating a memory card system to which a storage device in accordance with an embodiment of the present disclosure is applied.

Referring FIG. 18, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 19:
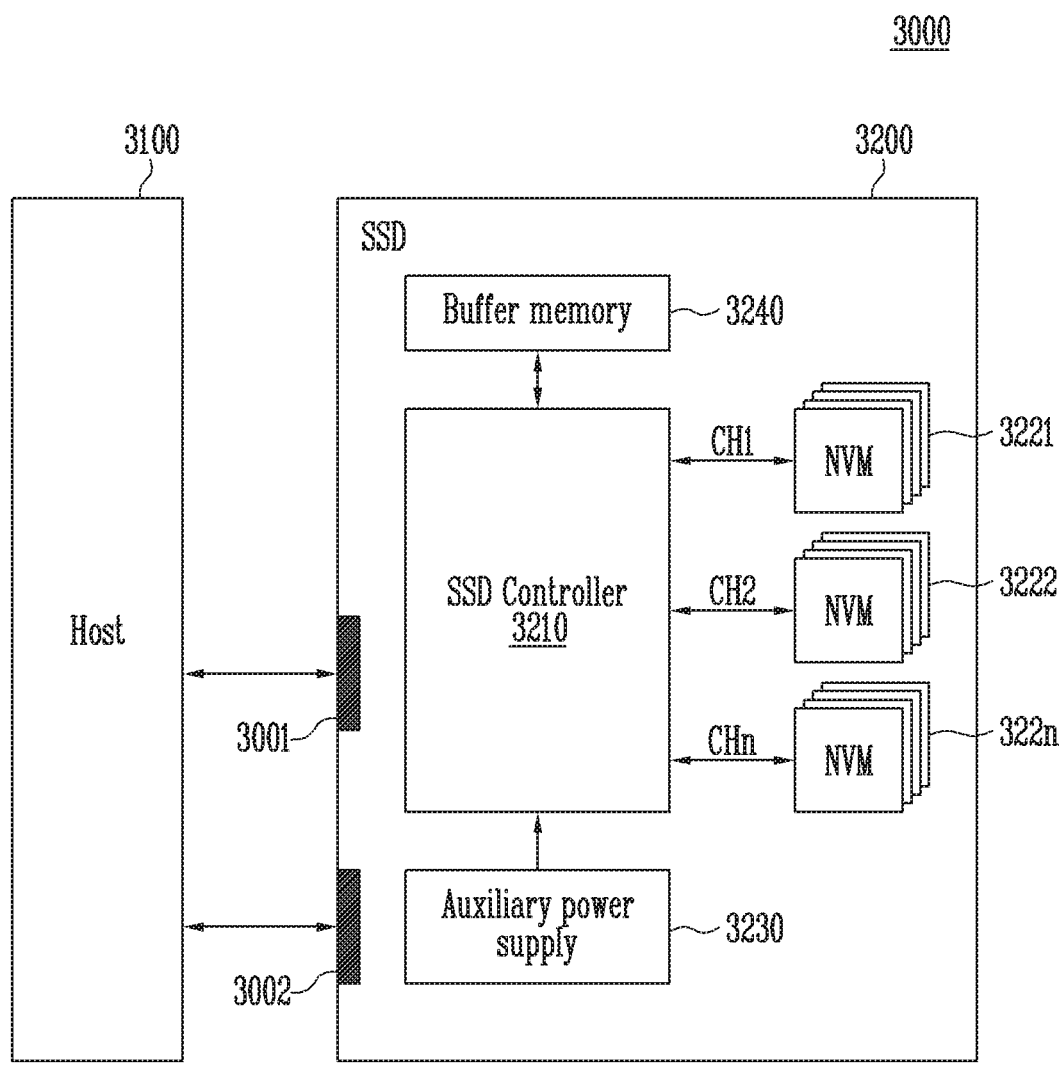
FIG. 19 is a block diagram illustrating a solid state drive (SSD) system to which the storage device in accordance with an embodiment of the present disclosure is applied.

FIG. 19 is a block diagram illustrating a solid state drive (SSD) system to which the storage device in accordance with an embodiment of the present disclosure is applied.

Referring to FIG. 19, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322*n*. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 20:
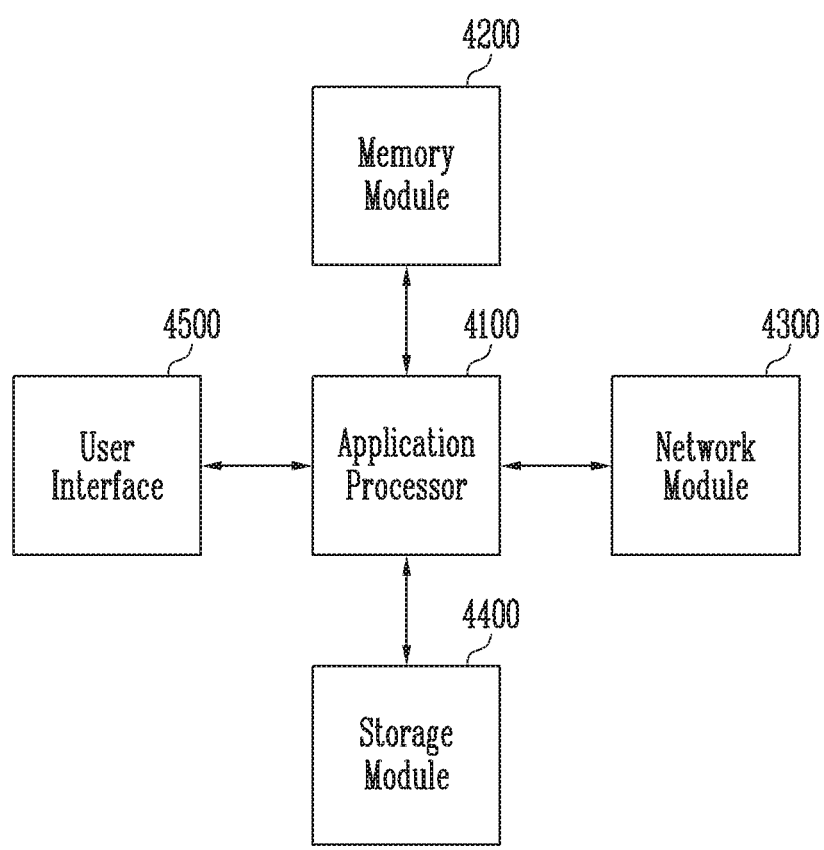
FIG. 20 is a block diagram illustrating a user system to which the storage device in accordance with an embodiment of the present disclosure is applied.

FIG. 20 is a block diagram illustrating a user system to which the storage device in accordance with an embodiment of the present disclosure is applied.

Referring to FIG. 20, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a liquid crystal display (LCD), an organic light emitting diode (OLED) display device, an active matrix OLED (AMOLED) display device, an LED, a speaker, and a motor.

Various embodiments of the present disclosure may provide a storage device having improved power defect management capability, and a method of operating the storage device.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller configured to control a memory device including a plurality of memory blocks each including a plurality of word line groups each coupled to a plurality of memory cells and a plurality of power modules configured to respectively provide voltages to the plurality of word line groups, the memory controller comprising:
   a fail block detector configured to detect fail blocks on which an erase operation has failed among the plurality of memory blocks, and detect fail word line groups among a plurality of word line groups included in each of the fail blocks;
   a fail block manager configured to detect, among the plurality of power modules, a defective power module providing the voltages to two or more fail word line groups each included in a different fail block among the fail blocks; and
   a power defect controller configured to control the memory device such that the defective power module is changed to another power module among the plurality of power modules.

2. The memory controller according to claim 1, wherein the fail block detector performs an erase verify operation of applying an erase verify voltage to the plurality of word line groups included in a selected memory block, among the plurality of memory blocks, and determines the selected memory block as a fail block, when a number of fail bits in the selected memory block exceeds a preset value in the erase verify operation, and wherein the number of fail bits indicates the number of memory cells having higher threshold voltage than the erase verify voltage, among a plurality of memory cells included in the selected memory block.

3. The memory controller according to claim 1, wherein the fail block detector performs an erase verify operation of applying an erase verify voltage to the plurality of word line groups included in a selected memory block, among the plurality of memory blocks, determines the selected memory block as a fail block, when at least one of the plurality of word line groups included in the selected memory block includes a fail word line, and wherein the fail word line is a word line in which a number of fail bits exceeds a preset value as a result of the erase verify operation, and wherein the number of fail bits indicates the number of memory cells having higher threshold voltage than the erase verify voltage among a plurality of memory cells coupled to the fail word line.

4. The memory controller according to claim 3, wherein the fail block detector generates fail block information indicating whether each of the plurality of word line groups included in the fail block is a fail word line group including the fail word line.

5. The memory controller according to claim 4, wherein the fail block manager stores a fail block table configured to include the fail block information, and wherein when two or more fail word line groups each included in a different fail block are provided with voltages from a same power module based on the fail block table, the fail block manager generates power defect information indicating that the same power module is the defective power module.

6. The memory controller according to claim 1, wherein the defective power module is a power module among the plurality of power modules, that provides voltages to the two or more fail word line groups each included in a different fail block.

7. The memory controller according to claim 1, wherein the another power module is a power module that provides voltages to word line groups that are different from and adjacent to the two or more fail word line groups each included in the different fail block.

8. The memory controller according to claim 1, wherein the power defect controller provides to the memory device a set parameter command for controlling the memory device to change the defective power module to the another power module.

9. A memory device comprising:

a memory cell array including a plurality of memory blocks each including a plurality of word line groups each coupled to a plurality of memory cells;

a voltage generator including a plurality of power modules configured to respectively provide voltages to the plurality of word line groups;

a power routing table configured to include power routing information indicating relationships between the plurality of word line groups and the plurality of power modules; and a control logic configured to perform an erase operation on the plurality of memory blocks, wherein the control logic sets the power routing table under control of an external controller such that a defective power module providing the voltages to two or more fail word line groups each included in a different fail block among fail blocks is changed to another power module among the plurality of power modules, and wherein the fail blocks are memory blocks among the memory blocks on which an erase operation has failed.

10. The memory device according to claim 9, wherein the control logic performs, under control of the external controller, an erase verify operation of applying an erase verify voltage to the plurality of word line groups included in the plurality of memory blocks, and wherein the two or more fail word line groups are word line groups on which the erase verify operation has failed among the plurality of word line groups included in the plurality of memory blocks.

11. A memory controller configured to control a memory device including a plurality of memory blocks each including a plurality of word line groups each coupled to a plurality of memory cells; and a plurality of power modules configured to respectively provide voltages to the plurality of word line groups, the memory controller comprising:

a fail block detector configured to detect a fail block including a fail word line on which an program operation has failed, among the plurality of memory blocks, and detect fail word line group including the fail word line, among a plurality of word line groups included in the fail block;

a fail block manager configured to detect, among the plurality of power modules, a defective power module providing the voltages to two or more fail word line groups each included in a different fail block among a plurality of fail blocks; and a power defect controller configured to control the memory device such that the defective power module is changed to another power module among the plurality of power modules.

12. The memory controller according to claim 11, wherein the fail block detector performs a program verify operation of applying a program verify voltage to a word line on which the program operation has performed.

13. The memory controller according to claim 12, wherein the fail word line is a word line in which a number of fail bits exceeds a preset value as a result of the program verify operation, and Wherein the number of fail bits indicates the number of memory cells having lower threshold voltage than the program verify voltage among a plurality of memory cells coupled to the fail word line.

14. The memory controller according to claim 13, wherein the fail block detector generates fail block information indicating whether each of the plurality of word line groups included in the fail block is the fail word line group.

15. The memory controller according to claim 14, wherein the fail block manager stores a fail block table configured to include the fail block information of the plurality of fail blocks, and wherein when two or more fail word line groups each included in a different fail block are provided with voltages from the same power module based on the fail block table, the fail block manager generates power defect information indicating that the same power module is the defective power module.

16. The memory controller according to claim 11, wherein the defective power module is a power module among the plurality of power modules, that provides voltages to the two or more fail word line groups each included in a different fail block.

17. The memory controller according to claim 11, wherein the power defect controller provides to the memory device a set parameter command for controlling the memory device to change the defective power module to the another power module.

18. A memory device comprising:
a memory cell array including a plurality of memory blocks each including a plurality of word line groups each coupled to a plurality of memory cells;
a voltage generator including a plurality of power modules configured to respectively provide voltages to the plurality of word line groups;
a power routing table configured to include power routing information indicating relationships between the plurality of word line groups and the plurality of power modules; and
a control logic configured to perform a program operation on a plurality of word lines included in each of the plurality of memory blocks,
wherein the control logic sets the power routing table under control of an external controller such that a defective power module providing the voltages to two or more fail word line groups each included in a different fail block among a plurality of fail blocks is changed to another power module among the plurality of power modules, and
wherein a fail block includes a fail word line on which the program operation has failed, and
wherein a fail word line group is a word line group including the fail word line, among the plurality of word line groups included in the fail block.

19. The memory device according to claim 18, wherein the another power module is, among the plurality of power modules, a power module that provides a voltage to a word line group that is different from and adjacent to the two or more fail word line groups each included in the different fail block.

20. A memory system comprising:
a memory device including:
a plurality of memory blocks each coupled to a plurality of word line groups; and
a plurality of power modules configured to provide one or more voltages to the memory blocks through the word line groups, respectively; and
a controller configured to:
control the memory device to perform data-change operations on the memory blocks by using the voltages; and
control the memory device to replace a defective power module with a normal power module among the power modules, when the data-change operations fail on memory cells coupled to two or more fail word line groups within two or more fail blocks among the memory blocks and the fail word line groups each included in a different fail block among the fail blocks are provided with the voltages from the defective power module among the power modules.

* * * * *